(12) United States Patent
Hardt et al.

(10) Patent No.: US 6,646,893 B1
(45) Date of Patent: Nov. 11, 2003

(54) CABLE MANAGEMENT SYSTEM AND METHOD OF INSTALLATION AND OPERATION THEREOF

(75) Inventors: Thomas T. Hardt, Missouri City, TX (US); Allison R. McGrew, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/209,616

(22) Filed: Jul. 30, 2002

(51) Int. Cl.[7] ................................................. H02B 1/20
(52) U.S. Cl. ...................... 361/826; 361/752; 361/730; 439/92; 439/95
(58) Field of Search ............................... 361/826, 827, 361/683, 681, 686, 752, 797, 730; 439/92, 95

(56) References Cited

U.S. PATENT DOCUMENTS

| | | | |
|---|---|---|---|
| 1,144,702 A | * 6/1915 | Forest | 182/235 |
| 4,145,027 A | * 3/1979 | Brimo | 182/193 |
| 5,653,518 A | 8/1997 | Hardt | 312/334.4 |
| 5,726,866 A | * 3/1998 | Allen | 361/816 |
| 6,129,429 A | 10/2000 | Hardt et al. | 312/223.2 |
| 6,326,547 B1 | 12/2001 | Saxby et al. | 174/69 |
| 6,330,168 B1 | 12/2001 | Pedoeem et al. | 361/826 |
| 6,407,933 B1 | 6/2002 | Bolognia et al. | 361/862 |
| 6,501,020 B2 | * 12/2002 | Grant et al. | 174/50 |

* cited by examiner

Primary Examiner—David Martin
Assistant Examiner—Hung Bui

(57) ABSTRACT

A system and method for supporting at least one electrical cable is provided. The at least one electrical cable may be secured to a movable electronic device disposed within a chassis. A harness is provided that is securable to at least one electrical cable. A flexible support member is provided to support the harness and the at least one electrical cable. The flexible support member may move with the electrical device as the electrical device is moved. The flexible support member may comprise wire. A wire reel may be provided to extend and retract the wire. The wire of the wire reel may be unwound as the electrical device is moved from a normal position to a withdrawn position. The wire of the wire reel may be wound as the electronic device is moved from the withdrawn position to the normal position.

25 Claims, 6 Drawing Sheets

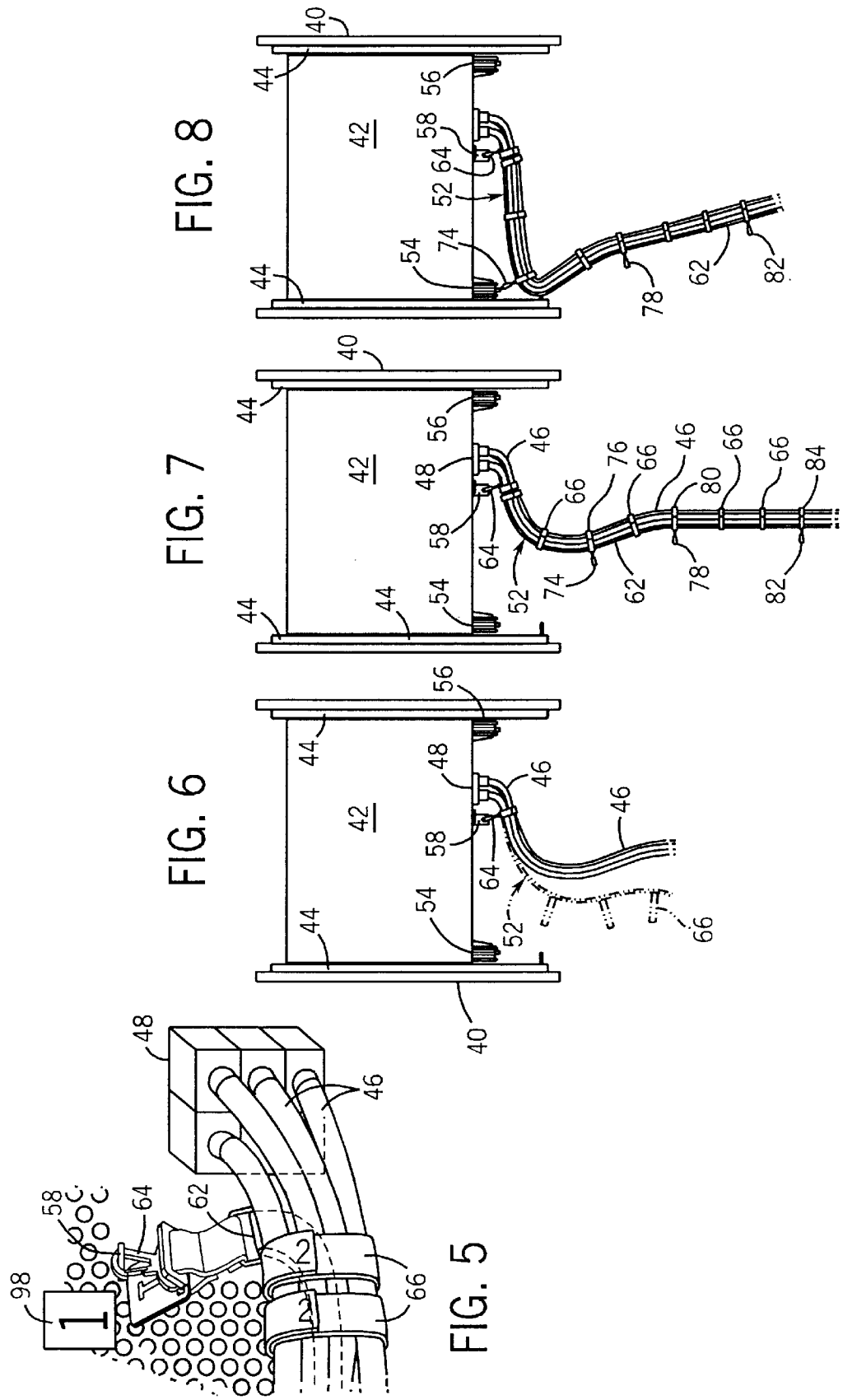

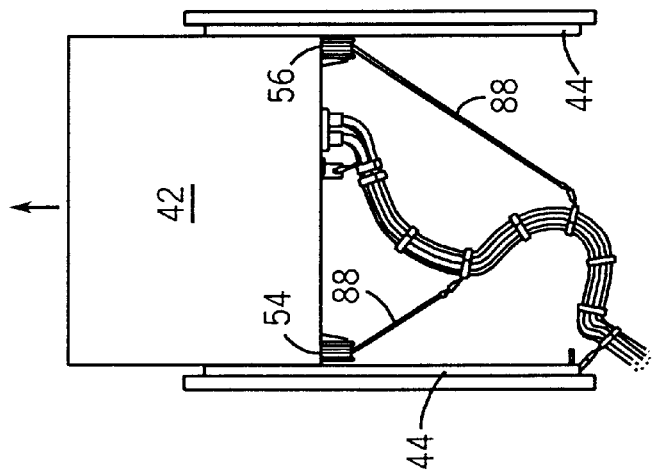
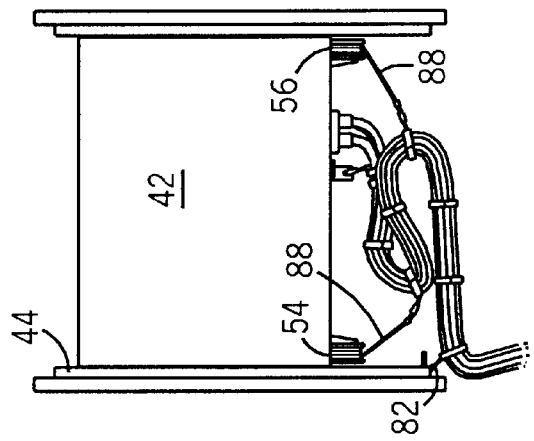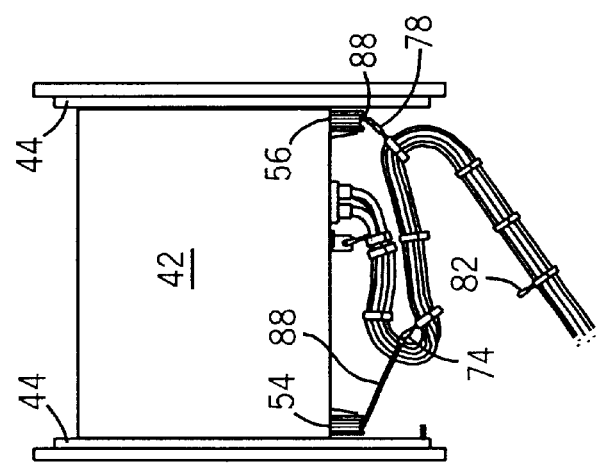

CABLE MANAGEMENT SYSTEM AND METHOD OF INSTALLATION AND OPERATION THEREOF

BACKGROUND OF THE INVENTION

1. Field of the Invention

This invention relates generally to electrical systems and, more particularly, to a technique for managing cables routed to a movable electrical device mounted within a chassis.

2. Background of the Related Art

This section is intended to introduce the reader to various aspects of art, which may be related to various aspects of the present invention described and/or claimed below. This discussion is believed to be helpful in providing the reader with background information to facilitate a better understanding of the various aspects of the present invention. Accordingly, it should be understood that these statements are to be read in this light, and not as admissions of prior art.

Electrical cables are commonly used to transmit power and/or data to and from electrical devices or systems. In fact, some electrical devices may have many electrical cables connected to them. In addition, some systems utilize several electrical devices. These devices may be mounted together in a storage system. Typically, electronic devices, such as computer servers, are mounted vertically within a chassis or rack. In addition, the storage system and the electrical device may be adapted to enable the electrical devices to be withdrawn, at least partially, from the rack. One reason for withdrawing an electrical device from a storage rack may be to gain access to the interior of the electrical device. Furthermore, the storage system may be adapted to support the electrical device while it is partially withdrawn from the rack.

Control of the electrical cables that may be deployed in an electrical system is important to prevent damage to the cables and to prevent the cables from becoming entangled. A cable management system may be used to support one or more electrical cables secured to an electrical device. For example, a cable management system may be used to route an electrical cable connected to a movable electronic device mounted within a rack, such as in a server system. In this situation, the cable management system is typically adapted to enable the electrical cable to move as the electrical device is moved. For example, cable management systems using articulated arms may be used to support electrical cables. The electrical cables are attached to the articulated arm. Typically, one end of the articulated arm is secured to the rack and one end is secured to the electrical device. The articulated arm is extended as the electrical device is moved away from the rack.

However, there are a number of problems associated with existing cable management systems. For example, a cable management system utilizing an articulated arm may have numerous pieces, adding to the expense of the system. In addition, the process of assembling the pieces to form the articulated arm and the process of routing and securing the electrical cable or cables may be difficult and time-consuming. Consequently, some customers of rack-mounted server systems do not install or use the articulated arm cable management systems provided. As a result, electrical cables connected to the server dangle from the server and may be damaged or entangled when the server is moved. Furthermore, with deeper servers, the arms may require the cables to have a sharp bend radius, which may damage the cables. In addition, the articulated arm may form an obstruction to air flow into or out of the server. The articulated arm cable management systems may also obstruct access to electrical connectors and components disposed on the rear of the server. In addition, existing cable management systems are not easily adaptable for use across a variety of rack-mounted systems. They may require unique tooling, such as the articulated arms, for each application.

BRIEF DESCRIPTION OF THE DRAWINGS

The foregoing and other advantages of the invention will become apparent upon reading the following detailed description and upon reference to the drawings in which:

FIG. 5 provides a rear view of the system to illustrate the securing of the cable harness to the electrical device;

FIGS. 6–10 provide top views to illustrate the installation of the cable management system in accordance with the present techniques; and FIG. 11 illustrates the cable management system supporting electrical cables secured to the electronic device when the electronic device is moved to a partially withdrawn position.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
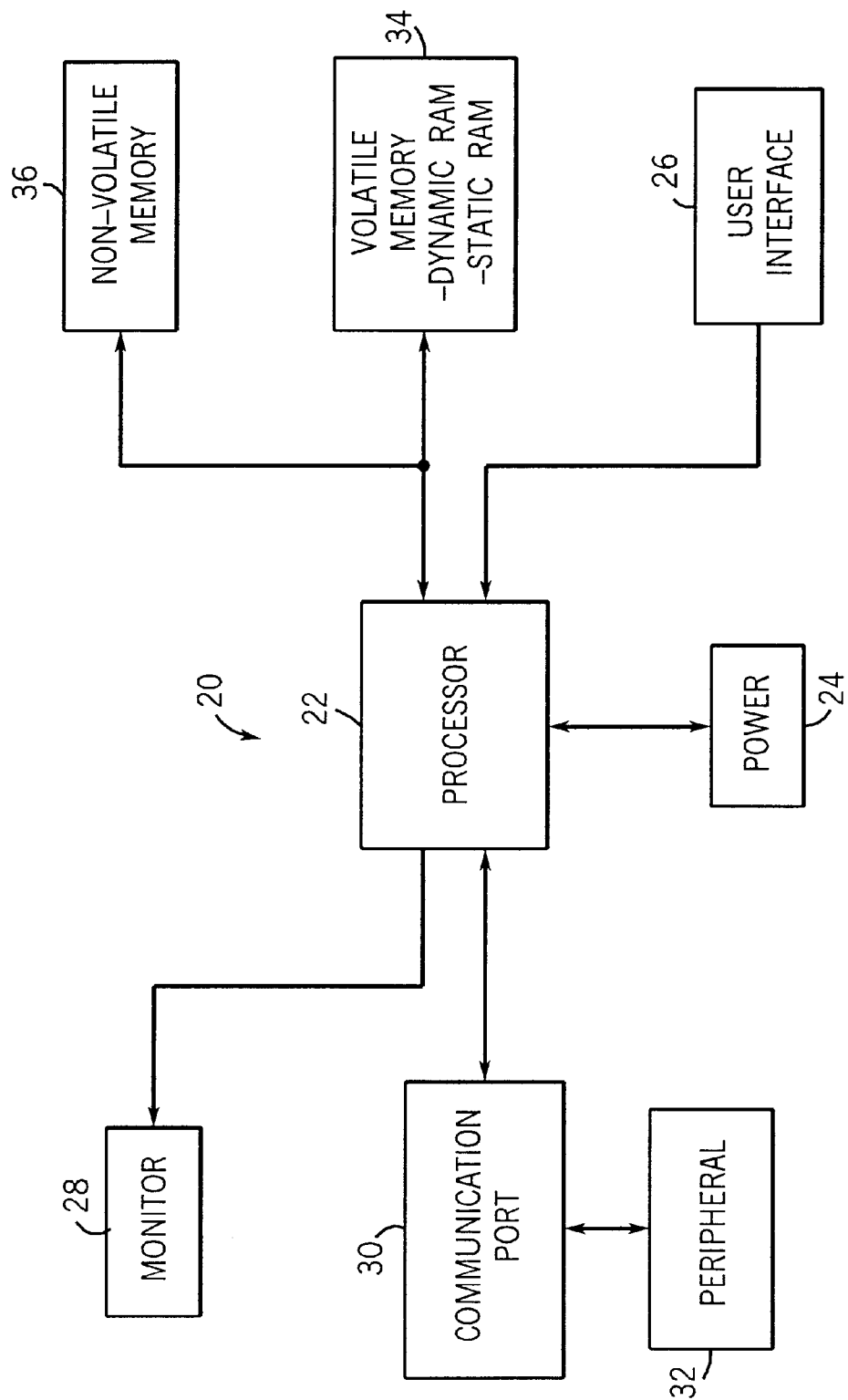
FIG. 1 illustrates a block-diagram of a computer system in accordance with the present techniques.

Turning now to the drawings and referring initially to FIG. 1, a block diagram of an exemplary processor-based system is illustrated. The processor-based system is generally designated by the reference numeral 20. The processor-based system 20 may be any of a variety of different types, such as a desktop computer, a server, or a mainframe computer. In addition, the processor-based device may be a piece of test equipment, such as an oscilloscope, electronic instrumentation, a process control device, etc. In the illustrated system, a processor 22 controls many of the functions of the system. A processor-based system typically includes a power supply 24. If the system is portable, power supply 24 includes permanent batteries, replaceable batteries, and/ or rechargeable batteries. Power supply 24 may also include an A/C adapter, so that the device may be plugged into a wall outlet, for instance. In fact, power supply 24 may also include a D/C adapter, so that the system 20 may be plugged into the D/C voltage of a vehicle.

Various other devices may be coupled to the processor 22, depending upon the functions of the system 20. For example, a user interface 26 may be coupled to processor 22. Examples of user interfaces 26 include buttons, switches, a keyboard, a light pen, a mouse, and/or a voice recognition system. A display 28 may also be coupled to processor 22. Examples of displays 28 include: a television screen, a computer monitor, an LED, or even an audio display. A communications port 30 may also be coupled to processor 22. The communications port 30 may be coupled to a peripheral device 32, such as a printer, a computer, or an external modem.

Typically, processor 22 utilizes programming to control the function of the system 20. Memory is coupled to processor 22 to store and facilitate execution of the programming. For example, processor 22 may be coupled to a volatile memory 34 and a non-volatile memory 36. Non-volatile memory 36 may include a read only memory (ROM), such as an EPROM, to be used in conjunction with volatile memory 34. The size of the ROM is typically selected to be just large enough to store any necessary operating system, application programs, and fixed data. Volatile memory 34, on the other hand, is typically quite large so that it can store dynamically loaded applications. Additionally, non-volatile memory 36 may include a high capacity memory such as a disk or tape drive memory. A variety of memory modules, such as DIMMs, DRAMs, SDRAMs, SRAMs, etc. can be utilized for a given device or application.

The various components of the processor-based system 20 may be coupled together by electrical cables. For example, an electrical cable may be used to couple the peripheral device 32 to the communications port 30. The present cable management system, discussed below, is particularly amenable to protecting electrical cables connected to electrical systems, such as the processor-based system 20 discussed above.

Figure 2:
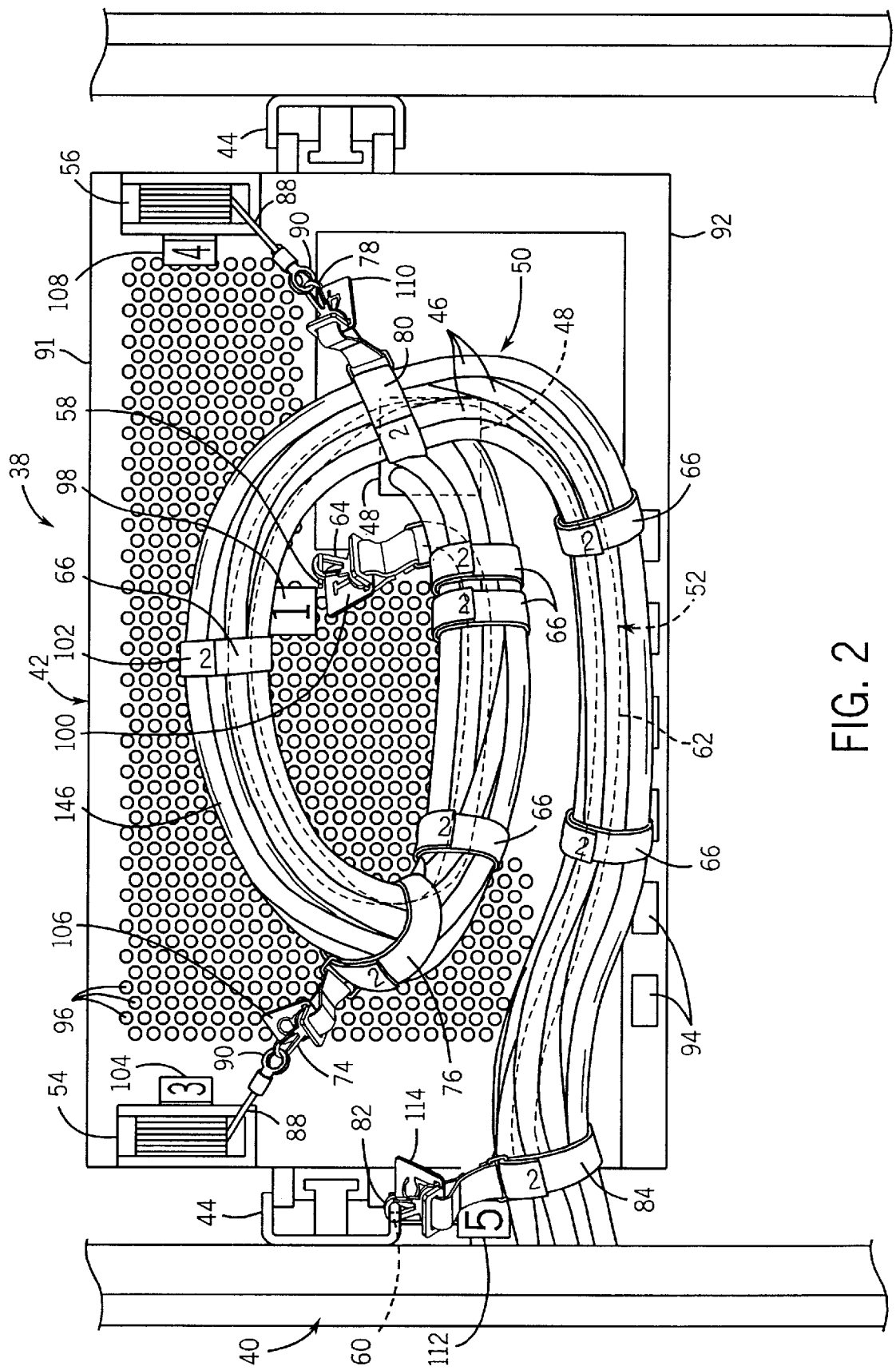
FIG. 2 illustrates a rear view of an electronic device and cable management system with the electronic device disposed in a first position within a chassis in accordance with the present techniques.
Figure 3:
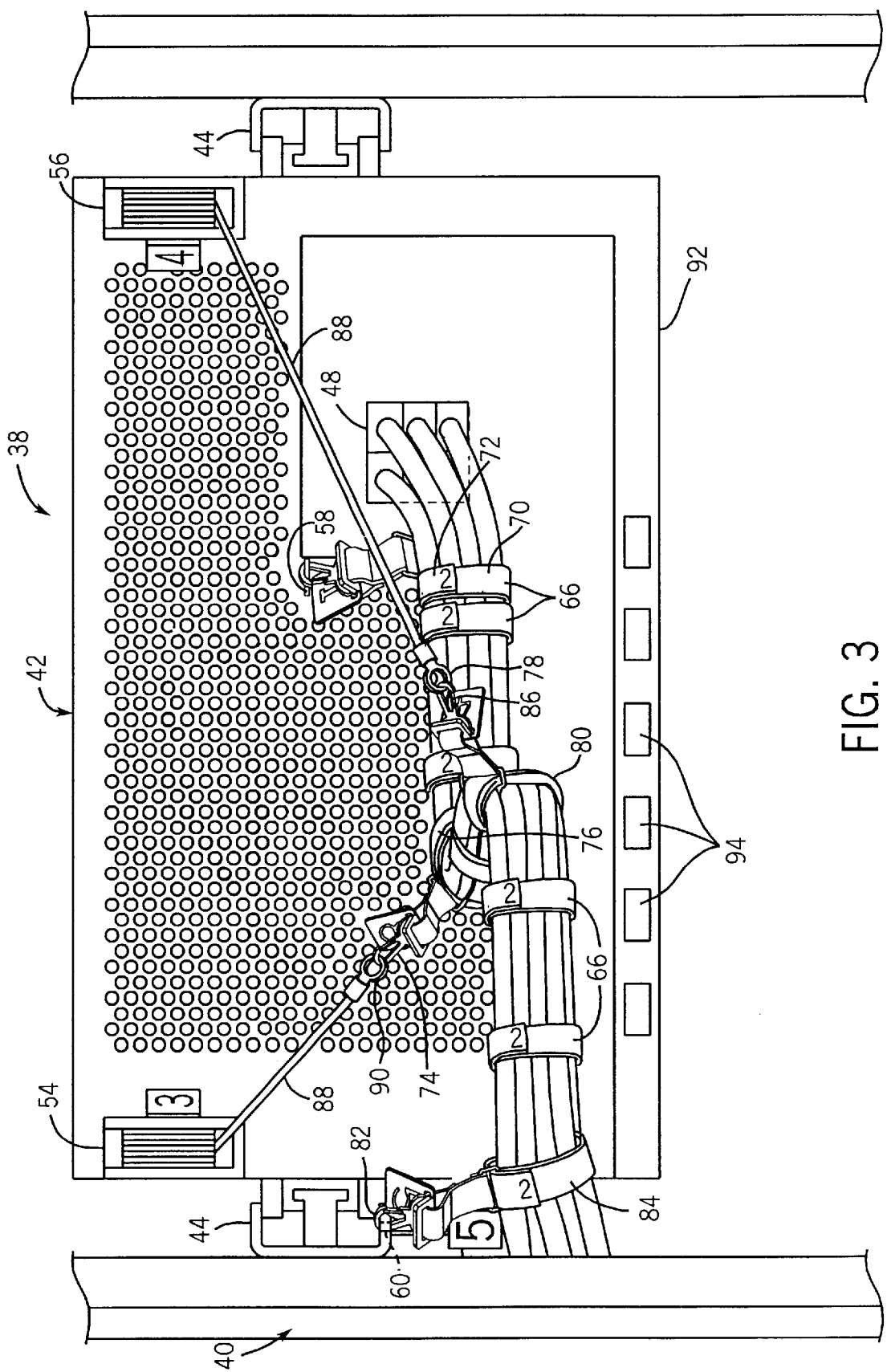
FIG. 3 illustrates a rear view of the electronic device and cable management system with the electronic device disposed in a second position relative to the chassis in accordance with the present techniques.

Referring generally to FIGS. 2 and 3, an electronic system 38 having a storage rack 40 and a rack-mounted device 42 is illustrated. In the illustrated embodiment, the rack-mounted device 42 is movable relative to the rack 40. In FIG. 2, the rack-mounted device 42 is illustrated in a first position relative to the rack 40, such as a fully seated position. In FIG. 3, the rack-mounted device is illustrated in a second position relative to the rack 40, such as a partially withdrawn psoition. The rack-mounted device 42 may be a processor-based device, such as processor-based system 20 described above, or another type of electrical device. In the illustrated embodiment, the rack-mounted device 42 is a server. The server 42 is movable along a rail 44 secured to the rack 40. The electrical cables 46 are secured, at one end, to electrical connectors 48 disposed on the rear of the server 42. The other end of the electrical cables may be routed to other devices within the rack 40, or to devices external to the rack 40.

The cable management system 50 is used to route and to support the plurality of electrical cables 46 within the rack 40. In the illustrated embodiment, several electrical cables 46 are routed to the server 42. However, the present technique is also applicable to a single electrical cable 46. In addition, the present technique also is applicable to manage fluid hoses and other flexible members adapted to transmit power, data, or material.

In the illustrated embodiment, the cable management system 50 comprises a cable harness 52, a first wire reel 54, and a second wire reel 56. The cable harness 52 is flexible and is used to control the electrical cables, such as securing them into a bundle. In addition, in the illustrated embodiment, the harness 52 is adapted to be secured to the electrical device 42, the wire reels 54 and 56, and the rack 40 to enable them to support the electrical cables 46. However, rather than wire reels, the cable management system 50 may comprise one or more flexible and/or elastic members, such as a rubber band or a bungee cord. Indeed, the cable management system 50 may comprise one or more wire reels and one or more elastic members. In the illustrated embodiment, the first wire reel 54 and the second wire reel 56 are secured to the server 42. However, the wire reels, or elastic members, may be secured to a movable portion of the rail 44, a stationary portion of the rail 44, or to the rack 42. The first and second wire reels may be secured to the server 42 as received or the first and second wire reels may be secured to the server 42 as part of the process of installing the harness 52. In the illustrated embodiment, the cable management system 50 also comprises a securing member 58, such as a ring, clip, velcro strap, etc., secured to the server 42 and a hole 60 extending through a portion of the rail 44.

In the illustrated embodiment, one end of the cable harness 52 is secured to the securing member 58 of the server 42 and the other end of the cable harness 52 is secured to the rail 44. In this embodiment, the ends of the harness 52 are supported by the server 42 and the rail 44. In addition, the wire reels 54 and 56 are used to support the portion of the harness 52 and electrical cables 46 between the server 42 and the rail 44. In this embodiment, the wire reels 54 and 56 are secured to the harness on opposite sides of the harness 52 to provide opposing forces to support the electrical cables therebetween. In addition, the wire reels are secured to the harness 52 at different points along the harness 52 to provide more points of support along the length of the harness 52.

As illustrated in FIG. 2, the harness 52 and electrical cables 46 are coiled or folded when the server 42 is positioned at its normal position within the rack 40. As illustrated in FIG. 3, the cable management system 50 is adapted to uncoil the harness 52 and electrical cables 46 as the server 42 is withdrawn from the storage rack 40. In addition, the cable management system 50 is adapted to coil the harness 52 and electrical cables 46 as the server 42 is returned to its normal position within the storage rack 40, as illustrated in FIG. 2. Alternatively, the cable management system 50 may be adapted to hold the harness 52 and electrical cables 46 in another shape, other than coiled, such as a zig-zag shape or an L-shape.

Figure 4:
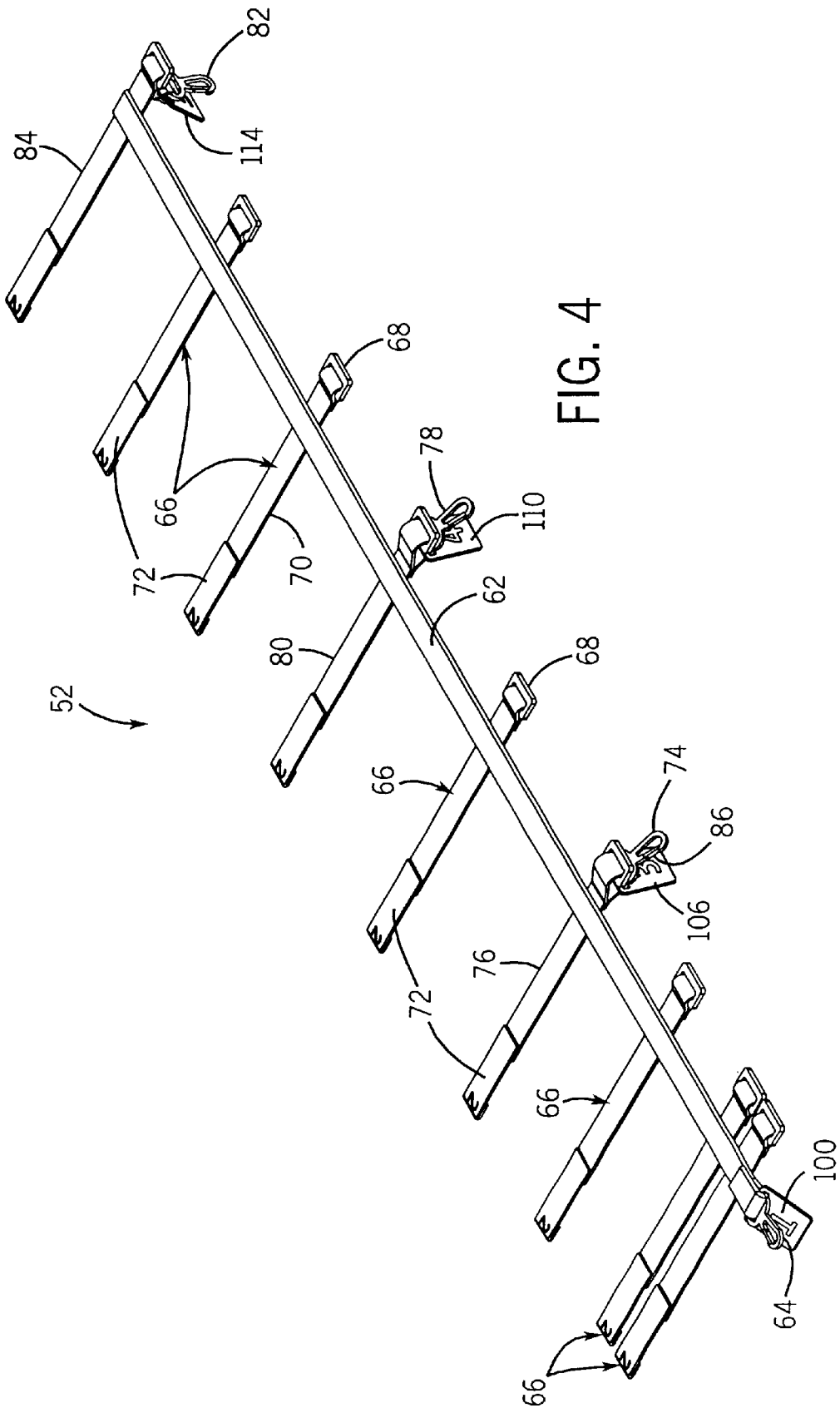
FIG. 4 illustrates a perspective view of a cable harness of the cable management system in accordance with the present techniques.

Referring generally to FIG. 4, the cable harness 52 has a spine 62 extending along the length of the harness 52. In the illustrated embodiment, a first hook 64 is disposed at one end of the spine 62. The first hook is adapted to secure the cable harness 52 to the securing member 58 disposed on the server 42. The cable harness 52 has a plurality of straps 66 disposed at various locations along the length of the spine 62. The straps 66 are adapted to secure the harness 52 to the electrical cables 46 and form them into a bundle. In the illustrated embodiment, each strap 66 has a buckle 68, a first portion 70, and a second portion 72. The first and second portions are adapted to secure to each other on contact, such as Velcro. Each strap 66 is wrapped around the plurality of electrical cables 46 and inserted through a buckle 68. The buckle 68 enables the strap 66 to tighten the bundle of electrical cables 46. The strap 66 may then be turned back on itself so that the second portion 72 is directed toward the first portion 70.

The harness 52 also is adapted to be secured to the first wire reel 54 and the second wire reel 56. The cable harness 52 has a second hook 74 secured to a strap 76. The second hook 74 is used to secure the cable harness 52 to the first wire reel 54. The cable harness has a third hook 78 secured to a different strap 80. The third hook 78 is adapted to secure the cable harness to the second wire reel 56. Finally, the cable harness 52 has a fourth hook 82 secured to a fourth strap 84. The fourth hook 82 is adapted to secure the cable harness 52 to the rail 44. In the illustrated embodiment, the fourth hook 82 is inserted through hole 60 and rail 44. In the illustrated embodiment, each of the hooks has a clasp 86 to maintain the hook secured.

Referring again to FIGS. 2 and 3, each of the wire reels 54 and 56 has a wire 88 wound onto the reel. In the illustrated embodiment, a ring 90 is secured to the end of each wire 88. The second hook 74 is secured to the ring 90 located at the end of the first wire reel 54 and the third hook 78 is secured to the ring 90 located at the end of the second wire reel 56. In the illustrated embodiment, each of the wire reels provides a biasing force to maintain the wire wound onto the reel. The biasing force is used to provide the force to enable the cable harness 52 to support the plurality of electrical cables 46 between the server 42 and the rail 44. Alternatively, the wires 88 may be secured to the harness 52 without being wound on a reel or without being biased. For example, the wires 88 may be secured to carriages that move along the rails as the server 42 is moved. In addition, at least one of the wires 88 may be an elastic member, such as a rubber band or bungee cord.

In the illustrated embodiment, the cable management system 50 maintains the portion of the electrical cables 46 bundled by cable harness 52 below the top 91 and above the bottom 92 of the server 42. This prevents the electrical cables 46 from being crimped between the server and another device, or entangled with another device, either above or below the server. 42 The portion of the electrical cables 46 bundled by cable harness 52 is maintained below the top of the server 42 and above the bottom 92 of the server 42 when the server 42 is in its normal position, as in FIG. 2, when the server is withdrawn at least partially from the rack 40, as in FIG. 3, and when the server 42 is moved between the two positions.

The server 42 has a second group of electrical connectors 94 disposed along a bottom portion of the server 42. The plurality of electrical connectors 94 may comprise a plurality of ports for communicating data, such as a serial port, a parallel port, a USB port, etc. The electrical cables 46 secured by the cable management system 50 may include electrical cables secured to the second group of electrical connectors 94. In addition, the portion of the server 42 illustrated has a plurality of ventilation holes 96 for allowing air to flow into and out of the interior of the server 42. When the server 42 is positioned in its normal position within the rack 40, as in FIG. 2, the cable management system 50 provides minimal obstruction to the flow of air into and out of the ventilation holes 96 because there is no articulated arm to serve as an obstruction to air flow. In addition, the harness 52 and wires 88 produce a minimal increase in the overall volume of the electrical cables 46. Furthermore, in this embodiment, the wire reels are disposed in the upper left and right of the device 42, out of the flow path for air into and out of the ventilation holes.

The process of installing the illustrated cable management system 50 is a multi-part process. The cable management system 50 utilizes a plurality of identifiers to facilitate the process of assembling of the cable management system 50. In the illustrated embodiment, a first identifier marked "1", designated by the reference numeral 98, is disposed on the rear portion of the server 42 proximate to the securing member 58. A second identifier marked "1", designated by the reference numeral 100, is disposed on the harness 52 proximate to the first hook 64. The identifiers marked "1" facilitate the identification of the first hook 64 as the correct hook to secure to the securing member 58. In addition, the identifiers marked "1" indicate the desired sequence of performance of the connection of the first hook 64 to the securing member 58 in a desired process of installing the harness 52.

In addition, each strap 66 has a first identifier marked "2", designated by the reference numeral 102. The labels marked "2" facilitate the location of the straps 66 and indicates that securing the straps 66 to the electrical cables 46 is performed second in the desired process of installing the harness 52.

A first identifier marked "3", designated by the reference numeral 104, is disposed proximate to the first wire reel 54. A second identifier marked "3", designated by the reference numeral 106, is disposed on the harness 52 proximate to the second hook 74. The identifiers marked "3" facilitate the identification of the second hook 74 as the correct hook to secure to the first wire reel 54 and indicates that the connection of the second hook 74 to the first wire reel 54 is performed third in the desired process of installing the harness 52.

A first identifier marked "4", designated by the reference numeral 108, is disposed proximate to the second wire reel 56. A second identifier marked "4", designated by the reference numeral 110, is disposed on the harness 52 proximate to the third hook 78. The identifiers marked "4" facilitate the identification of the third hook 78 as the correct hook to secure to the second wire reel 56 and indicates that the connection of the third hook 78 to the second wire reel 56 is performed fourth in the desired process of installing the harness 52.

Finally, a first identifier marked "5", designated by the reference numeral 112, is disposed proximate to the hole 60 through the rail 44. A second identifier marked "5", designated by the reference numeral 114, is disposed on the harness 52 proximate to the fourth hook 82. The identifiers marked "5" facilitate the identification of the fourth hook 82 as the correct hook to secure through the hole 60 and indicates that the connection of the fourth hook 82 through the hole 60 is performed fifth in the desired process of installing the harness 52.

Referring generally to FIGS. 5–10, as discussed above, the process of installing the cable management system 50 is a multi-part process. Typically, the first act of the process is to secure the first hook 64 of the harness 52 to the securing member 58 disposed on the server 42, as illustrated in FIG. 5. This secures the harness 52 to the server 42.

Then, the next act of the process is to secure each of the plurality of straps 66 around the electrical cables 46, as illustrated in FIGS. 6 and 7. The first identifiers marked "2", designated by the reference numeral 102, located on each of the straps 66 indicate to an installer that securing the straps 66 to the electrical cables 46 is performed second in the desired process, after the harness 52 is secured to the server 42.

The next act of the process is to secure the second hook 74 to the first wire reel 54, as illustrated in FIG. 8. The first identifiers marked "3", designated by reference numeral 104 and 106, located proximate to the second hook 74 and the first wire reel 54 indicate to an installer that securing the second hook 74 to the first wire reel 54 is performed third in the process, after the plurality of straps 66 are wrapped around and secured to the electrical cables 46.

The next act of the process is to secure the third hook 78 to the second wire reel 56, as illustrated in FIG. 9. The first identifiers marked "4", designated by reference numeral 108 and 110 and located proximate to the third hook 78 and the second wire reel 56, indicate to an installer that securing the third hook 78 to the second wire reel 56 is performed after the second hook 74 is secured to the first wire reel 54.

The next act of the process is to secure the fourth hook 82 through the hole 60 in the rail 44, as illustrated in FIG. 10. The first identifiers marked "5", designated by reference numerals 112 and 114 and located proximate to the fourth hook 82 and the hole 60 through the rail 44, indicate to an installer that securing the fourth hook 82 through the hole 60 is performed after the third hook 78 is secured to the second wire reel 56.

Referring generally to FIGS. 2, 3 and 11, the illustrated cable management system 50 supports the electrical cables 46 when the server 42 is positioned in a first position within the rack 40, as illustrated in FIG. 2, and when the server is moved to a second position, as illustrated in FIGS. 3 and 11. As the server 42 is moved from the first position to the second position, the end of the harness 52 secured to the server 42 is displaced relative to the end of the harness secured to the rail 44 and the harness 52 and electrical cables 46 are uncoiled from a coiled position. The wire 88 of each of the wire reels is unwound from the reels as the harness 52 is uncoiled. The biasing force provided by the wire reels supports the weight of the portion of the electrical cables 46 supported by the cable management system 50 and maintains tension in the wires as the wires are unwound from the wire reels. The force provided by the wire reels via the wires is operable to support the harness 52 and the electrical cables 46 as the wire is unwound from the reels, so that the portion of the electrical cables 46 bundled by cable harness 52 is maintained above the bottom 92 of the server 42.

The techniques discussed above provide an easier process for installing a cable management system, as well as routing and supporting cables. The time consumed in installing the cable management system is minimal. In addition, unlike an articulated arm system, the harness, cable, and support wires are flexible to enable the harness and cable to be moved out of the way to provide access to all electrical connectors and components disposed on the rear of an electrical device. In addition, the system may be easily modified for applications in different racks and for different electrical devices. For example, the harness may be lengthened or shortened, as desired. In addition, the straps may be lengthened or shortened, as desired, to accommodate different numbers of cables.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An electrical system comprising:
   an electrical device adapted to receive at least one electrical cable;
   a chassis adapted to receive the electrical device and enable the electrical device to move relative thereto; and
   a cable management system adapted to support the at least one electrical cable, comprising:
     a harness securable to a portion of at least one electrical cable;
     a first biasing member securable to the harness and adapted to support the harness, the at least one biasing member comprising a first reel movable with the electrical device, the first reel having a first line wound thereon, wherein the first reel is spring-loaded to maintain a tensile force on the first line; and
     a second biasing member securable to the harness and adapted to support the harness, the second biasing member comprising a second reel movable with the electrical device, the second reel having a second line wound thereon, wherein the second reel is biased to maintain a tensile force on the second line.

2. The electrical system, as set forth in claim 1, wherein the first and second biasing members are disposed on opposite sides of the harness to support the harness therebetween.

3. The electrical system, as set forth in claim 1, wherein the electrical device has a top surface and a bottom surface, the cable management system being adapted to maintain the portion of the at least one electrical cable secured to the harness below the top surface and above the bottom surface of the electrical device.

4. The electrical system, as set forth in claim 1, wherein the cable management system is adapted to coil the at least one electrical cable as the electrical device is moved to a first position and to uncoil the at least one electrical cable as the electrical device is moved to a second position.

5. The electrical system, as set forth in claim 1, wherein the harness is adapted to be secured to the electrical device.

6. The electrical system, as set forth in claim 1, wherein the harness is adapted to be secured to a portion of the chassis.

7. The electrical system, as set forth in claim 1, wherein the harness comprises a plurality of securing straps disposed along the harness, each strap being adapted to secure the at least one electrical cable to the harness.

8. The electrical system, as set forth in claim 1, wherein the electrical device comprises a server.

9. An electrical system comprising:
   an electrical device adapted to receive at least one electrical cable;
   a rack adapted to receive the electrical device and to enable the electrical device to move relative thereto; and
   a cable management system adapted to support the at least one electrical cable, comprising:
     a first wire reel having a first wire securable to the at least one electrical cable, the first wire reel being biased to apply a tensile force to the first wire; and
     a second wire reel having a second wire securable to the at least one electrical cable, the second wire reel being biased to apply a tensile force to the second wire,
     wherein the first wire reel and second wire reel are disposed to support the at least one electrical cable therebetween.

10. The electrical system, as set forth in claim 9, comprising a flexible harness securable to the at least one electrical cable, the first and second wires being securable to the flexible harness.

11. The electrical system, as set forth in claim 9, wherein the harness is adapted to receive the first wire at a first position axially along the harness and to receive the second wire at a second position axially along the harness.

12. The electrical system, as set forth in claim 11, wherein the harness comprises a plurality of securing straps disposed along the harness, each strap being adapted to extend around the at least one electrical cable to secure the harness to the at least one electrical cable.

13. The electrical system, as set forth in claim 10, where the harness comprises a plurality of securing rings disposed along the harness and the first and second wires comprise a hook adapted to secure to a securing ring.

14. The electrical system, as set forth in claim 9, wherein the flexible harness, first wire reel, and second wire reel are adapted to coil the at least one electrical cable as the electrical device is moved to a first position and to uncoil the at least one electrical cable as the electrical device is moved to a second position.

15. The electrical system, as set forth in claim 9, wherein the first and second wire reels comprises a spring to bias the wire reel to wind the wire onto the first and second wire reels.

16. The electrical system, as set forth in claim 9, wherein the first and second wire reels are secured to the electrical device.

17. The electrical system, as set forth in claim 9, wherein the electrical device has a top surface and a bottom surface, the first and second wire reels being adapted to apply tensile forces sufficient to maintain the at least one electrical cable below the top surface and above the bottom surface of the electrical device.

18. The electrical system, as set forth in claim 9, wherein the electrical device comprises a server.

19. An electrical system comprising:
   an electrical device adapted to receive a plurality of electrical cables;
   a rack adapted to receive the electrical device and to enable the electrical device to move relative thereto; and
   a cable management system adapted to support the plurality of electrical cables, comprising:
      a harness having a plurality of securing straps adapted to be extend around the plurality of electrical cables; and
      a plurality of support members adapted to attach to the harness at a plurality of points along the length of the harness to support the plurality of electrical cables, wherein the plurality of support members comprises:
         a first reel having a first line securable to the harness, the first reel being biased to apply a tensile force to the first line and
         a second reel having a second line securable to the harness, the second reel being biased to apply a tensile force to the second line.

20. The electrical system, as set forth in claim 19, wherein the first and second reels are secured to the electrical device.

21. The electrical system as recited in claim 20, wherein the first and second reels are disposed on opposite sides of the electrical device.

22. The electrical system, as set forth in claim 21, wherein the electrical device has a top surface and a bottom surface, the harness, first reel, and second reel being adapted to maintain the portion of the at least one electrical cable secured to the harness below the top surface and above the bottom surface of the electrical device.

23. The electrical system, as set forth in claim 19, wherein the cable management system is adapted to coil the at least one electrical cable as the electrical device is moved to a first position and to uncoil the at least one electrical cable as the electrical device is moved to a second position.

24. The electrical system, as set forth in claim 19, wherein the plurality of securing straps are adapted to secure to themselves after being wrapped around the at least one electrical cable.

25. The electrical system, as set forth in claim 19, wherein the electrical device comprises a server.

* * * * *